US010708995B2

(12) United States Patent
Ku et al.

(10) Patent No.: US 10,708,995 B2
(45) Date of Patent: Jul. 7, 2020

(54) COLOR MIXING MONOLITHICALLY INTEGRATED LIGHT-EMITTING DIODE PIXELS

(71) Applicant: The Regents of The University of Michigan, Ann Arbor, MI (US)

(72) Inventors: Pei-Cheng Ku, Ann Arbor, MI (US); Kunook Chung, Ann Arbor, MI (US); Brandon Demory, Whitmore Lake, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 15/977,011

(22) Filed: May 11, 2018

(65) Prior Publication Data

US 2018/0332677 A1 Nov. 15, 2018

Related U.S. Application Data

(60) Provisional application No. 62/505,258, filed on May 12, 2017.

(51) Int. Cl.
*H05B 33/08* (2020.01)
*H05B 45/40* (2020.01)
(Continued)

(52) U.S. Cl.
CPC ........... *H05B 45/40* (2020.01); *H01L 27/156* (2013.01); *H01L 33/06* (2013.01); *H01L 33/24* (2013.01);
(Continued)

(58) Field of Classification Search
CPC ............ H05B 33/0809; H05B 33/0827; H05B 33/0833; H05B 33/0845; H05B 33/0857; H01L 33/34; H01L 33/44
(Continued)

(56) References Cited

U.S. PATENT DOCUMENTS

| 8,735,867 B2 * | 5/2014 | Seong | ................... H01L 27/156 |
| | | | 257/13 |
| 2003/0011559 A1 * | 1/2003 | Adachi | ................ G09G 3/3406 |
| | | | 345/102 |

(Continued)

OTHER PUBLICATIONS

H. Park et al "Compact Near-Eye Display System Using a Superlens-based Microlens Array Magnifier", Opt. Express 23 30618-33 (2015).

(Continued)

*Primary Examiner* — Tung X Le
(74) *Attorney, Agent, or Firm* — Harness, Dickey & Pierce, P.L.C.

(57) ABSTRACT

Additive color mixing across the visible spectrum was demonstrated from a light emitting diode (LED) pixel comprising of red, green, and blue subpixels monolithically integrated and enabled by local strain engineering. The device was fabricated using a top-down approach on a metal-organic chemical vapor deposition-grown sample consisting of a typical LED epitaxial stack. The three color subpixels were defined in a single lithographic step. The device was characterized for its electrical properties and emission spectra under an uncooled condition, which is desirable in practical applications. The color mixing was controlled by pulse width modulation and the degree of color control was also characterized.

16 Claims, 17 Drawing Sheets

(51) Int. Cl.
*H01L 27/15* (2006.01)
*H01L 33/24* (2010.01)
*H01L 33/06* (2010.01)
*H01L 33/58* (2010.01)
*H01L 33/32* (2010.01)
*H01L 33/00* (2010.01)
*H01L 33/08* (2010.01)
*H05B 45/20* (2020.01)

(52) U.S. Cl.
CPC .......... *H01L 33/0075* (2013.01); *H01L 33/08* (2013.01); *H01L 33/32* (2013.01); *H01L 33/58* (2013.01); *H05B 45/20* (2020.01)

(58) Field of Classification Search
USPC .................................................. 315/307, 312
See application file for complete search history.

(56) References Cited

U.S. PATENT DOCUMENTS

| | | | | |
|---|---|---|---|---|
| 2004/0046720 | A1* | 3/2004 | Nagai | G09G 1/285 345/82 |
| 2008/0303018 | A1* | 12/2008 | Kim | H01L 33/34 257/13 |
| 2010/0149221 | A1* | 6/2010 | Li | G09G 3/3413 345/690 |
| 2010/0264400 | A1* | 10/2010 | Kim | H01L 33/08 257/13 |
| 2011/0126891 | A1* | 6/2011 | Goto | B82Y 20/00 136/255 |
| 2013/0201408 | A1* | 8/2013 | Murai | H04N 9/31 348/744 |
| 2016/0305631 | A1* | 10/2016 | Hansen | F21V 7/0016 |
| 2017/0005207 | A1* | 1/2017 | Li | H01L 31/02327 |
| 2018/0182279 | A1* | 6/2018 | Sakariya | G09G 3/2014 |

OTHER PUBLICATIONS

K. Chung et al "Monolithically Integrated Red, Green, and Blue LED Pixels for Micro-Displays", 21st Microptics Conference, Berkeley, CA (2016).

C. Teng et al "Strain-Induced Red-Green-Blue Wavelength Tuning in InGaN Quantum Wells", Applied Physics Letters 108, 071104 (2016).

K. Chung et al "Monolithic Integration of Individually Addressable Light-Emitting Diode Color Pixels", Applied Physics Letters 110 (2017).

H. Choi et al "Nitride Micro-Display With Integrated Micro-Lenses" Phys. Status Solidi c2 2903-6 (2005).

* cited by examiner

Aperture Formation

SiN Deposition

PMMA Spin Coating

COLOR MIXING MONOLITHICALLY INTEGRATED LIGHT-EMITTING DIODE PIXELS

CROSS-REFERENCE TO RELATED APPLICATIONS

This application claims the benefit of U.S. Provisional Application No. 62/505,258, filed on May 12, 2017. The entire disclosure of the above application is incorporated herein by reference.

GOVERNMENT CLAUSE

This invention was made with government support under Grant No. DMR-1409529 and DMR-1120923 awarded by the National Science Foundation. The Government has certain rights in this invention.

BACKGROUND

The light-emitting diode (LED) based microdisplay technology can meet the stringent demands for future augmented reality applications by providing the needed brightness, contrast, resolution, power efficiency, and device lifetime beyond the capabilities of current liquid crystal or organic LED display technologies. Because LEDs are inherently monochromatic while displays require individually addressable red, green, and blue channels, attempts to realize an LED microdisplay typically involve assembly of three types of LED devices or selective deposition of different phosphor materials on a single-color LED pixel array. Recently, various approaches have been introduced to enable monolithic integration of multi-color LED pixels on the same chip, which can potentially enable a higher spatial resolution and cut down the production cost. These methods include controlling and varying indium composition using selective area epitaxy, selective carrier injection into multiple quantum wells (MQWs) of different indium compositions, and generating and controlling colors using local strain engineering. Despite the initial successes of these monolithic approaches, color mixing has not been demonstrated. Color mixing is one of the key elements for any display technology. It requires independent and linear control of the intensity from each color channel. At the same time, the color coordinates of these color channels must remain stable. In this disclosure, we present color mixing from a full-color LED pixel comprising of three independent color channels, monolithically integrated on the same chip using local strain engineering.

This section provides background information related to the present disclosure which is not necessarily prior art.

SUMMARY

This section provides a general summary of the disclosure, and is not a comprehensive disclosure of its full scope or all of its features.

A multi-color light device is presented. The light device is comprised generally of two or more subpixels formed on a substrate and a controller. Each subpixel includes one or more light emitting diodes (LEDs) and each light emitting diode is a nanopillar, such that diameter of the nanopillars between the two of more subpixels is different but the diameter of nanopillars within a given subpixel is the same. The controller is independently coupled to the light emitting diodes in each of the two or more subpixels. The controller supplies driving signals to the light emitting diodes in each of the two or more subpixels, such that magnitude of driving signals is the same amongst the two or more subpixels but duty cycle of the driving signals are adjustable independently amongst the two or more subpixels.

In one aspect, a lens is formed over top of each of the light emitting diodes in the two or more subpixels. Each lens is configured to have its focal point in an active region of corresponding nanopillar.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

Figure 1:
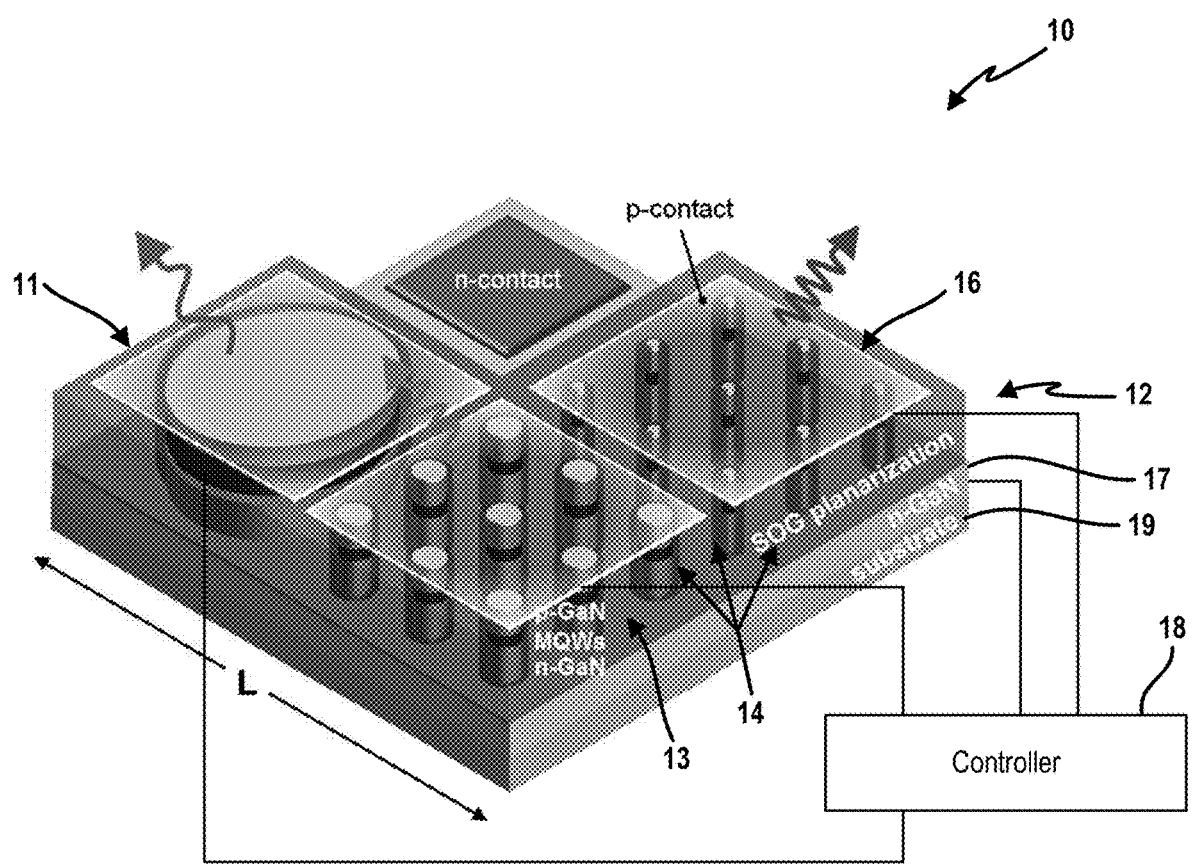
FIG. 1 is a perspective view of an example embodiment of a multi-color light device.

FIG. 1 depicts an example embodiment of a multi-color light device 10. The multi-color light device 10 is comprised of two or more subpixels monolithically integrated on a substrate 19. In this example, the light device 10 includes three subpixels: red 11, blue 12 and green 13. Each subpixel includes one or more light emitting diodes (LEDs). Other colors and arrangements for the subpixels are contemplated within the broader aspects of this disclosure.

More specifically, an LED is comprised of one or more nanopillars 14. In some cases, an LED is comprised of an array of nanopillars. Each nanopillar 14 includes a p-type portion separated by an active region from an n-type portion. The active region is comprised of heterostructures capable of generating light in the visible spectrum. The same active region is shared by all nanopillars. One example of such heterostructures is one or more quantum wells. Within a given subpixel, the diameter of the nanopillars is the same. Amongst the subpixels, the diameter of the nanopillars can be different. By varying the diameter, the emission color of the subpixel can be controlled. In the example embodiment, the subpixel emitting red light was formed by a 400 μm×400 μm thin film LED. The subpixel emitting green light was formed by nanopillars have a 150 nm diameter; whereas, the subpixel emitting blue light was formed by nanopillars have a 50 nm diameter. It is understood these values are merely illustrative and not limiting.

To drive the multi-color light device, each subpixel is individually addressable. For example, p-contacts for the nanopillars in a given subpixel share a common electrode and thus are configured to receive the same driving signal; whereas, the n-contact for the nanopillar in each of the subpixels shares one common electrode. In the example embodiment, an electrode 16 for each subpixel is formed on top of the nanopillars while a common electrode 17 is formed underneath the nanopillars. In this way, the driving signals for each subpixel can be adjusted independently.

A controller 18 is electrically coupled to the nanopillars in each of the subpixels and is configured to supply a driving signal. In the example embodiment, the driving signals are pulse width modulated electrical currents. Emission intensity emitted by the light device 10 can be controlled by independently adjusting the duty cycle of the driving signals sent to each subpixel as will be further described below. While reference is made to pulse width modulation, other types of driving signals, such as pulse frequency modulated electrical currents, also fall within the scope of this disclosure.

Figure 2A:
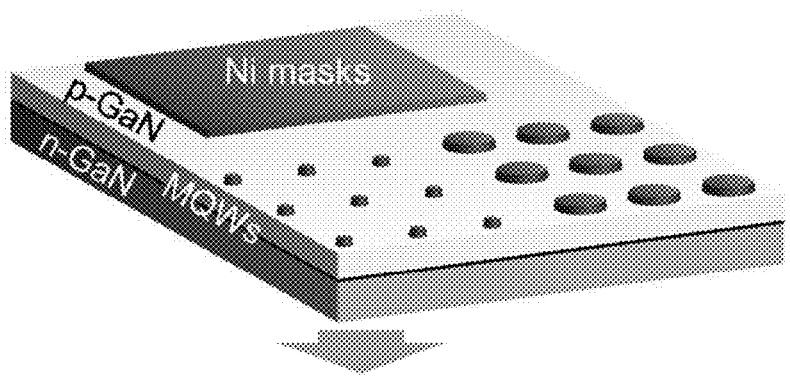
FIGS. 2A-2C are diagrams illustrating an example technique for fabricating the multi-color light device.
Figure 2B:
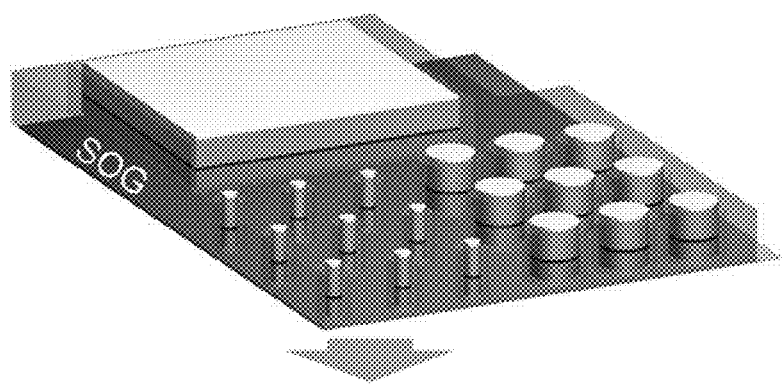
Figure 2C:
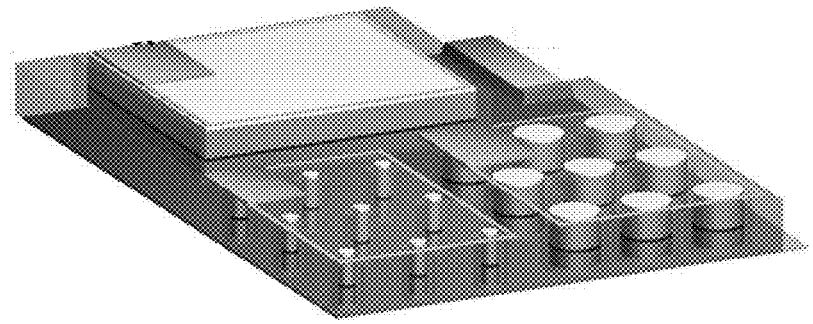

FIGS. 2A-2C illustrate an example technique for fabricating the multi-color light device 10. As a starting point, an epitaxial structure is grown on substrate. For the example embodiment, the epitaxial structure was grown on a 2" diameter c-plane sapphire substrate using metal-organic chemical vapor deposition. The epitaxial structure consists of five periods of $In_xGa_{1-x}N$/GaN multiple quantum wells (MQWs). The indium composition and quantum wells thickness were controlled such that the photoluminescence showed red emissions (i.e., λ~600 nm across the wafer). A 20 nm thick electron blocking layer of Mg-doped Al0.2Ga0.8N was also inserted between the top layer of the MQWs and the Mg-doped p-GaN layer. Other types of materials are contemplated by this disclosure including other III-N, III-V and II-VI direct bandgap semiconductors exhibiting a wurtzite crystal structure and a compressively strained active region.

After growth, the red-green-blue (RGB) subpixels were fabricated. The emission wavelength of an InGaN LED comprising a multiple-quantum-well (MQW) active region is determined by the structure of the quantum well, including the alloy compositions in both the quantum well and barrier and the thickness of the quantum well as well as the amount of strain in the quantum well. For MQWs grown on c-plane GaN, the strain in the QW can drastically shift the emission wavelength from the bulk bandgap due to the quantum-confined Stark effect (QCSE). To enable multiple emission wavelengths on the same chip, one must be able to locally control one or more of the following three parameters: the alloy composition of the quantum wells, the thickness of the quantum wells, and the strain in the quantum well grown on a polar plane. Changing the QW/barrier composition or thickness can be achieved by multiple epitaxial steps or using selective-area epitaxy. But these approaches only generate a limited range of spatial frequency and contrast, and therefore may not be appropriate for applications that require ultra-small and—dense color pixels such as in displays. Changing the strain in the quantum wells, on the other hand, can be achieved by patterning the quantum wells into nanopillars. Thus, local strain engineering is used as the preferred color generation mechanism.

Referring to FIG. 2A, nanopillars are defined using electron-beam lithography and etching. For example, the nanopillars are etched primarily in two steps. First, the nanopillars were dry etched using inductively coupled plasma reactive ion etching (ICP-RIE). Second, wet etching was performed (e.g., using 2% buffered KOH) to achieve the final diameter as well as to remove any damaged materials at the surface caused by dry etch. The total etching depth was measured to be 300 nm, around 50 nm over the active region. Nickel was used as the etch mask and was kept throughout the entire LED process to protect the surface of p-GaN. Nanopillars can also be patterned by nanoimprint lithography, optical lithography, interference lithography and other suitable methods After defining the nanopillars, the sample was planarized using spin-on-glass (SOG) as seen in FIG. 2B. To better isolate the p-contact and n-GaN, a thin 50 nm Si3N4 layer can be conformally coated on GaN using plasma-enhanced chemical vapor deposition (PECVD). It is understood that other materials, such as polyimide, can be used for planarization.

After planarization, the insulating layers were etched back using ICP-RIE to expose the tips of the nanopillars. The Ni etch mask was also removed by HNO3 solutions before the metallization of p-contacts and n-contacts. The electrical interconnects were then patterned onto the device as seen in FIG. 2C. The p-contacts and the n-contacts may be deposited, for example using sputtering or evaporation. The p-contact may also be thermally annealed in air.

While an exemplary fabrication technique has been described above with specific material having specific values and arranged in a specific configuration, it will be appreciated that the multi-color light device 10 may be constructed with many different configurations, materials, and/or values as necessary or desired for a particular application. The above configurations, materials and values are presented only to describe one particular embodiment that has proven effective and should be viewed as illustrating, rather than limiting the present disclosure.

In this embodiment, the RGB color subpixels were designed such that their output intensities can be comparable for proper color mixing. For example, the red emission was generated by a 400 μm×400 μm thin-film LED. The green and blue emissions were generated from arrays of nanopillars. The green and blue subpixels consisted of 341×341 and 434×434 arrays of nanopillars, respectively. The spacing between two adjacent nanopillars was fixed at 300 nm for the ease of electron-beam lithography. It is possible to use interference or nanoimprint lithography to obtain a higher density of nanopillars. In this case, the active region areas for the red, green, and blue subpixels are 160,000 μm, 2050 μm and 370 μm, respectively. The distance between each subpixel was 150 μm. The red subpixel area is intentionally made much larger to compensate for the low radiative efficiency due to the quantum-confined Stark effect (QCSE). In other embodiments, the efficiency of red emission is increased by using nanopillar structures.

Figure 3:
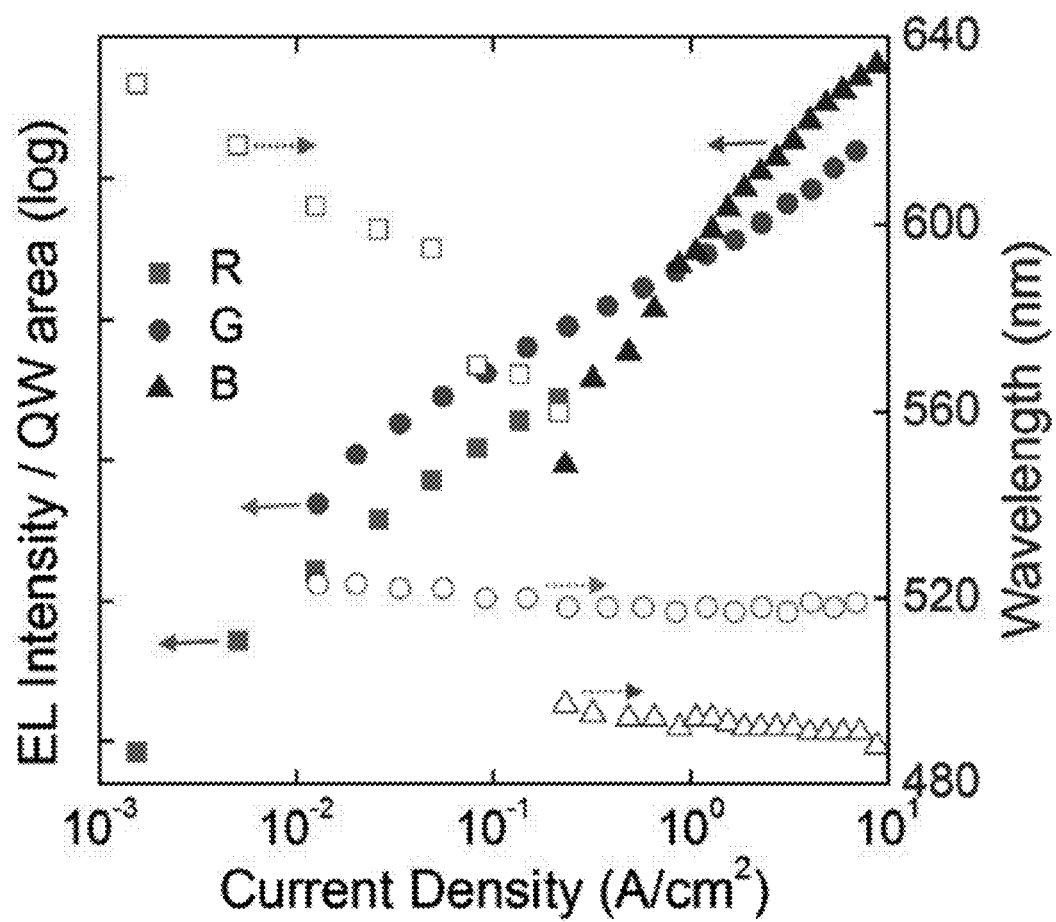
FIG. 3 is a graph showing the electroluminescence intensity-current density characteristics and peak emission wavelength for the multi-color device.

To generate color mixing, the RGB subpixels were biased at a fixed voltage modulated using a pulse-width modulation (PWM) scheme controlled by a microcontroller. The sample was uncooled without any passive or active temperature control, a condition desirable for practical applications. All subpixels shared a common n-contact while being individually addressed by separate p-contacts. For demonstration purposes, the output spectra of the device were captured from the emission through the substrate using Ocean Optics HR2000. The sapphire substrate was polished before the measurement to emission being captured from the substrate side. The voltages applied to the three subpixels were chosen to achieve comparable electroluminescence (EL) intensity outputs and the desired red emission wavelength. With reference to FIG. 3, the red emission experienced a strong QCSE with the increasing current density while the blue and green emission wavelengths remained relatively constant. A bias voltage for the red subpixel was chosen first such that its emission wavelength is >~600 nm. The bias voltage for the blue and green subpixels was then fixed such that they generated comparable output power as the red subpixel. In a microdisplay, the same bias voltage to all subpixels is desirable and can be achieved by fine tuning the ratios of the active region areas. But the ability to adjust the intensity from the blue and green subpixels without changing their color coordinates greatly simplified the color mixing experiment presented below.

Figure 4A:
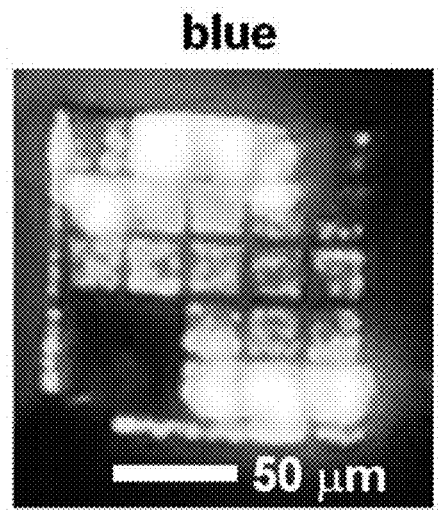
FIGS. 4A-4C are images of the subpixels in the multi-color device under bias.
Figure 4B:
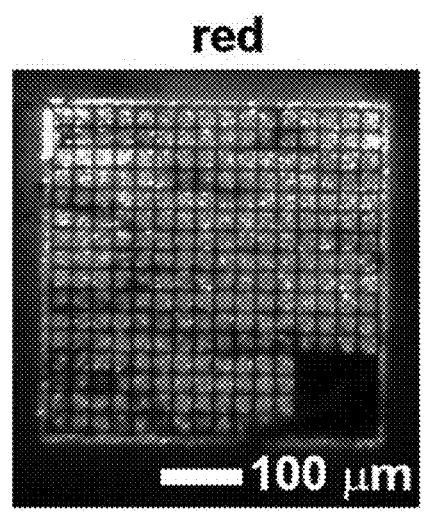
Figure 4C:
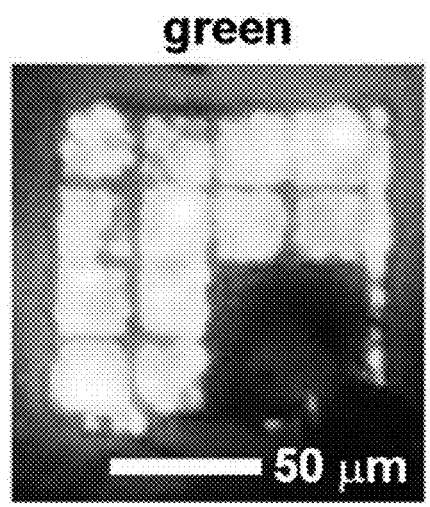

FIGS. 4A-4C shows light emission images from the RGB subpixels along with their spectra under different PWM duty cycles. The PWM frequency was fixed at 1 kHz while the pulse width was varied from 100 μs to 900 μs. The frequency was sufficiently high that no light flickering was observable with the unaided eye. Meanwhile, some nonuniform intensity distributions was observed within each subpixel, presumably because of the contact failures between the nanopillars and the thin (8/8 nm) Ni/Au bilayer at some local regions. However, this problem can be addressed by optimizing the fabrication process, such as using a sufficiently thick transparent conducting layer on the thin Ni/Au layer for more uniform current injection.

Figure 4D:
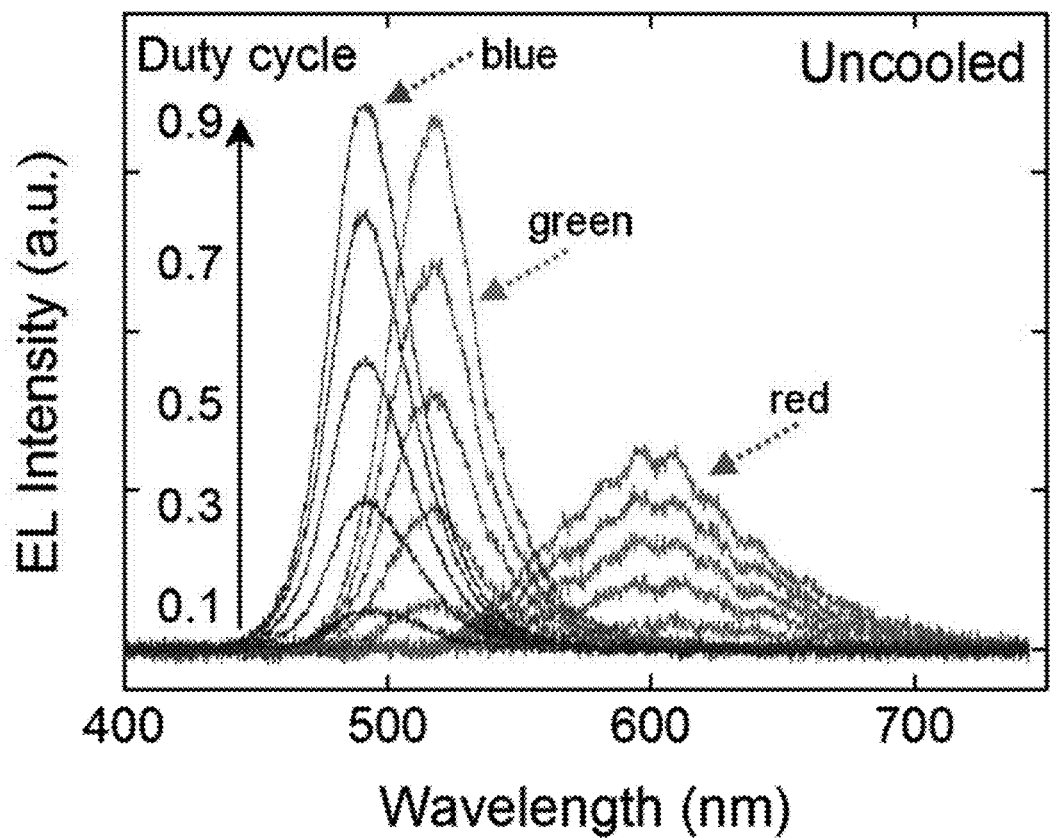
FIG. 4D is a graph showing the electroluminescence spectra of the subpixels as a function of pulse width modulation (PWM) duty cycle.

FIG. 4D shows the EL spectra of the RGB subpixels at different PWM duty cycles. The bias voltages (and currents) were maintained at constant values as described above. Only one dominant peak was observed for each spectrum. The dominant EL peaks were observed at 490 nm, 518 nm, and 600 nm for the blue, green, and red subpixels, respectively. When adjusting the duty cycle, the PWM maintained the color stability of all subpixels very well. At a 90% duty cycle, the ratios of the total output power from the RGB subpixels were measured at 1:1.3:1.3.

Figure 5A:
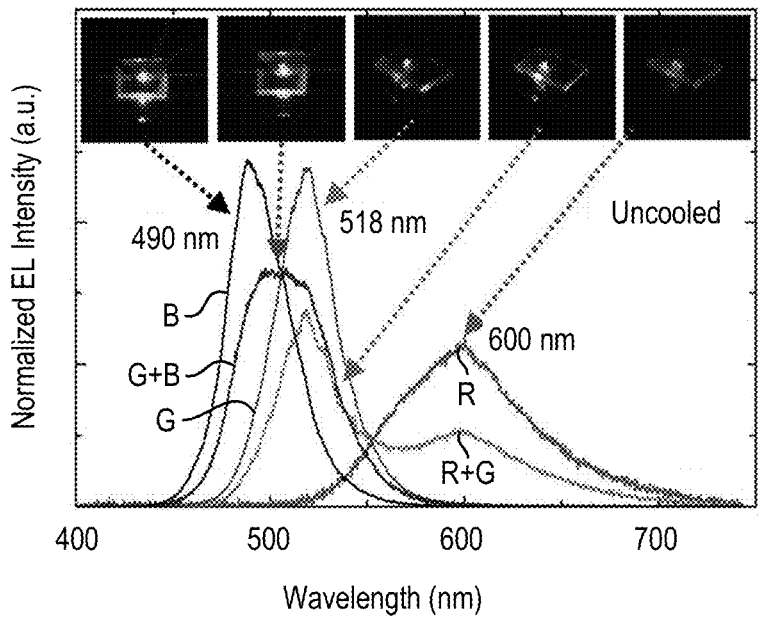
FIG. 5A is a graph showing the electroluminescence spectra and corresponding light emission images.
Figure 5B:
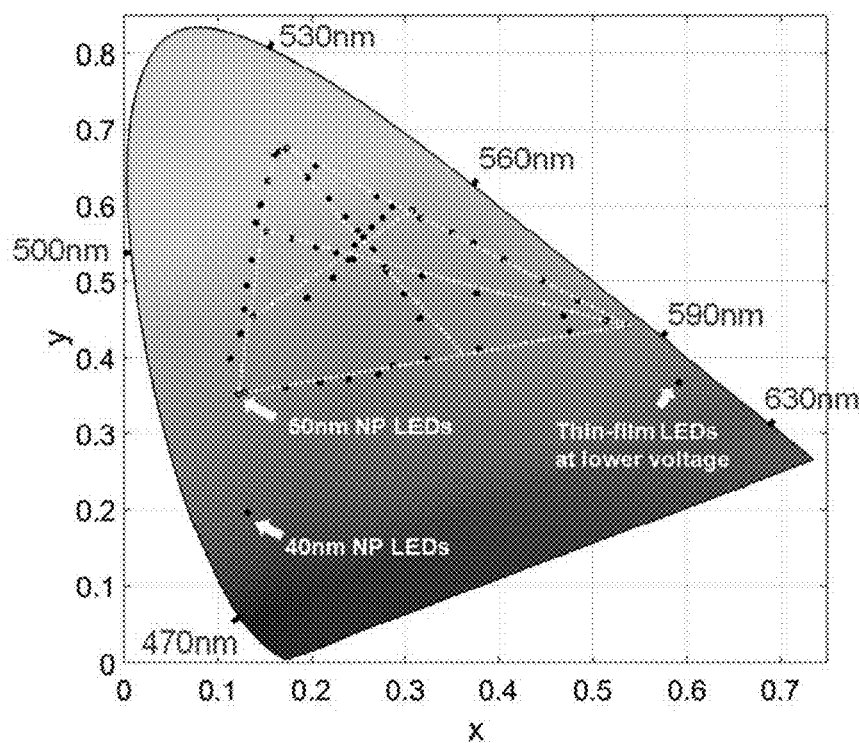
FIG. 5B illustrates the electroluminescence spectra of the light device plotted on a CIE 1931 chromaticity diagram.

FIG. 5A shows the color images and spectra of the color mixing results. Specifically, cyan and yellow colors were obtained using mixtures of blue and green, and green and red, respectively. The corresponding EL spectra clearly shows the combinations of each independent primary color emission. Furthermore, the linearity of color mixing was investigated. Mainly, the investigation was performed to verify that there was no crosstalk between subpixels when their duty cycles were independently tuned. FIG. 5B shows the result on a CIE-1931 chromaticity diagram. The contributions from each subpixel were varied systematically according to a linear superposition and converted the measured spectrum to the CIE-1931 color coordinates. Ideally, these color coordinates should fall on lines connecting between the two end points on the color space, i.e., with one or two of the subpixels completely turned off. These "ideal" cases are presented using the dotted lines on the color space. The good agreement between the experimental data points (circle dots) and the theoretical curves (dotted lines) confirms the good linearity of the color mixing results. The color gamut covered by the current light device 10 is still smaller than desired for the display applications. A larger color gamut can be achieved by increasing the wavelength of the initial active region prior to the nanopillar patterning and/or by decreasing the wavelength of the blue subpixel by using smaller-diameter nanopillars.

Figure 6:
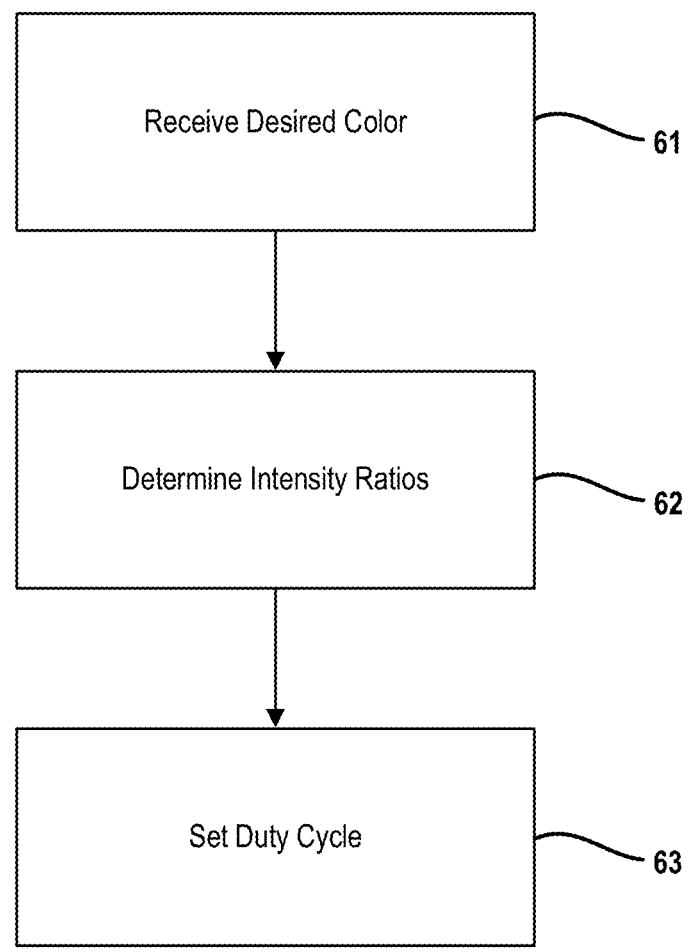
FIG. 6 is a flowchart depicting an example technique for color mixing.

Color mixing can be achieved through proper control of the driving signals supplied to each subpixel by the controller 18. In particular, the intensity ratio between the subpixels is controlled by setting the duty cycle of the driving signals. An example technique for implementing color mixing is further described in relation to FIG. 6.

First, a desired output color is input and thus received at 61 by the controller. The desired color may be specified as a color coordinate in a color space or in a chromaticity diagram. The CIE 1931 color space is used in the example embodiment although other color spaces fall within the scope of this disclosure.

Figure 7A:
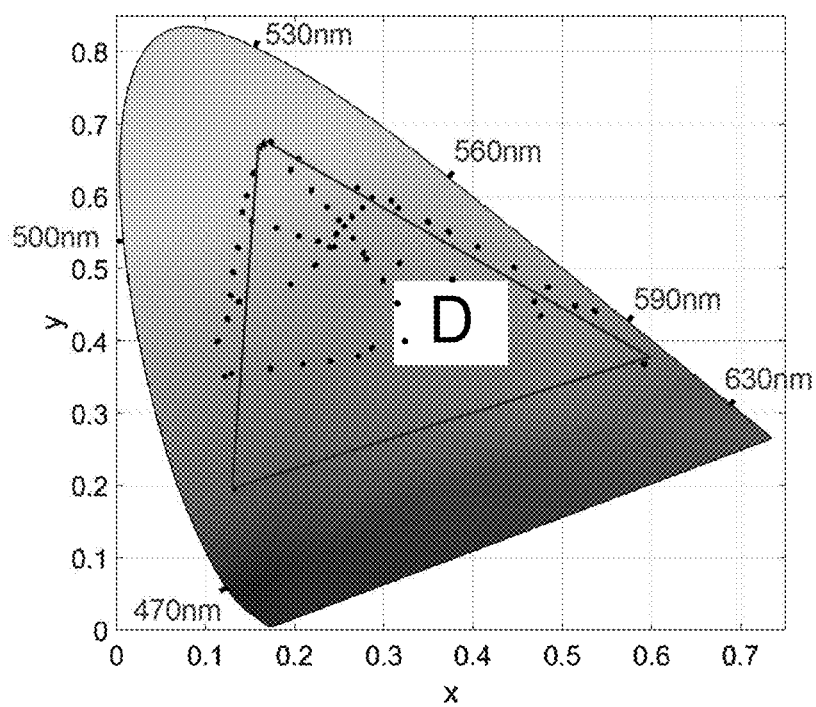
FIGS. 7A and 7B illustrate how to determine intensity ratio for driving signals using a chromaticity diagram.

To achieve the desired color, the controller 18 determines the intensity ratio between the two or more subpixels as indicated at 62. In the example embodiment, there are three subpixels: red, blue and green. For each subpixel, the emitted wavelength is known to the controller and plotted in the color space. A triangle is drawn in the color space connecting color coordinates for each of the three subpixels. The color coordinate for the desired color, D, is also defined in the color space as shown in FIG. 7A.

Figure 7B:
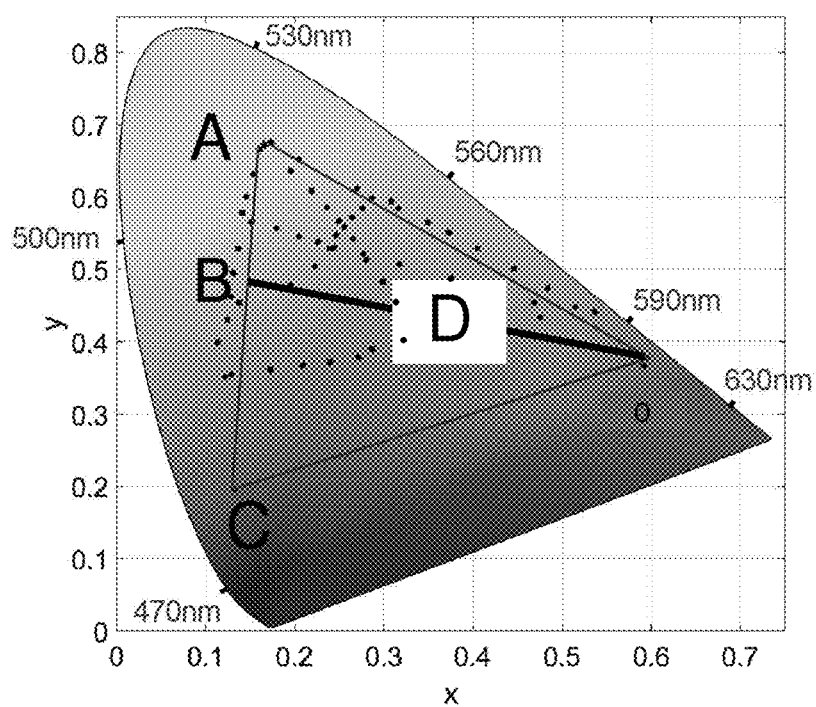

To determine the intensity ratios, a line is first drawn from any one of the three corners of the triangle through the color coordinate for the desired color until it intersects an opposing side of the triangle as seen in FIG. 7B. In this example, the line was drawn from the color coordinate corresponding to the red pixel. The drawn line intersects the triangle side into two segments: AB and BC. The ratio of the length between these two segments is then used to set the intensity of two of the subpixels. Specifically, the ratio is used to set the intensity of the two subpixels at each end of the triangle side intersected by the drawn line. In this example, the blue and green subpixels are set to the ratio AB:BC.

The color coordinate for the desired color partitions the drawn line into two segments: BD and DO. The intensity of the remaining subpixel (i.e., red) is set in accordance with the ratio of the lengths between these two segments. That is, the ratio of the intensity of the red subpixel to the combined intensity of the blue and green pixels is BD:DO.

Returning to FIG. 6, the controller sets the duty cycle of the driving signals at 63 in accordance with the determined intensity ratios. It is to be understood that only the relevant steps of the method are discussed in relation to FIG. 6, but that other software-implemented instructions may be needed to control and manage the overall operation of the light device 10.

Figure 8:
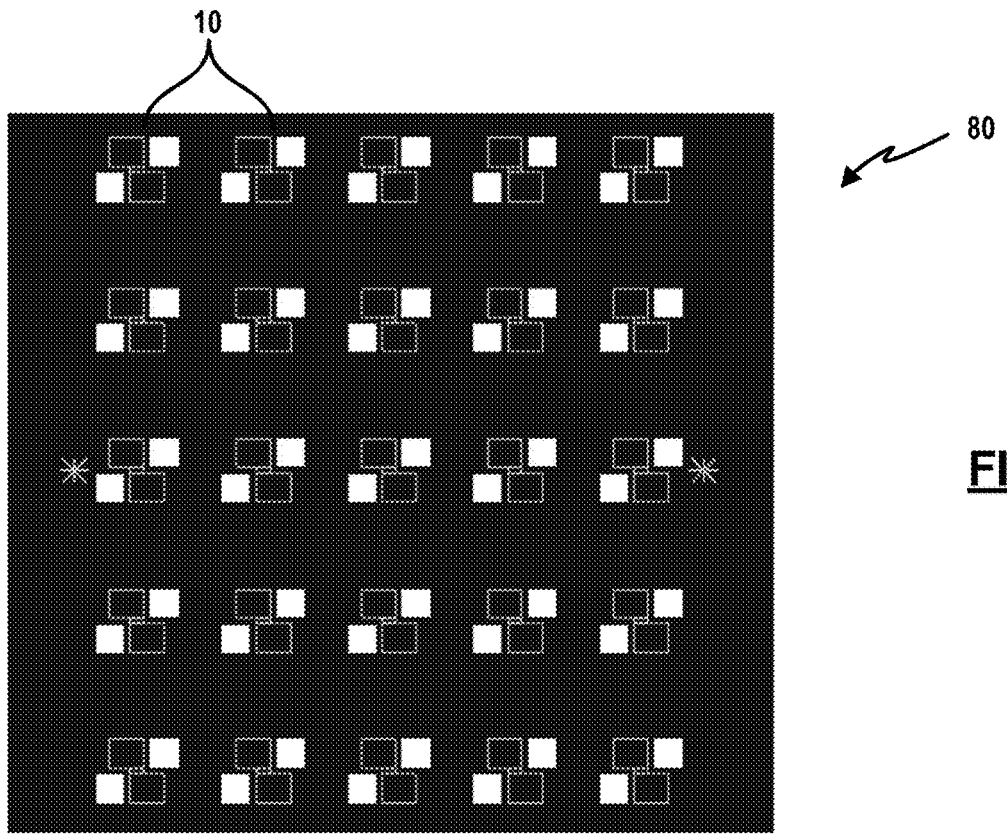
FIG. 8 is a diagram depicting an arrangement of 5×5 array of light devices forming a display.
Figure 9A:
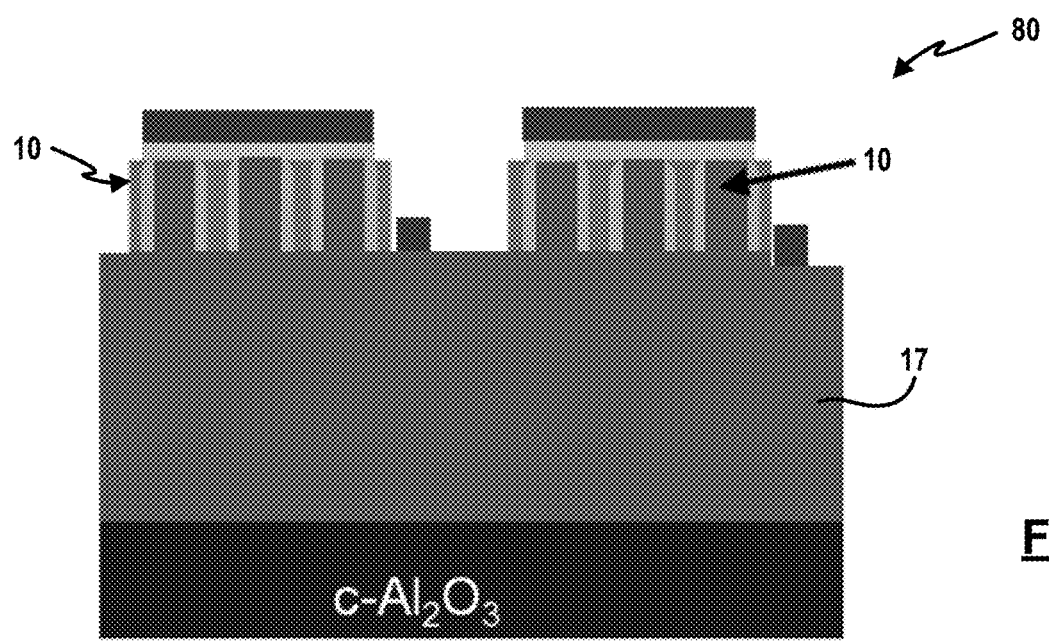
FIGS. 9A-9C are diagrams illustrating a portion of the fabrication process for the display.
Figure 9B:
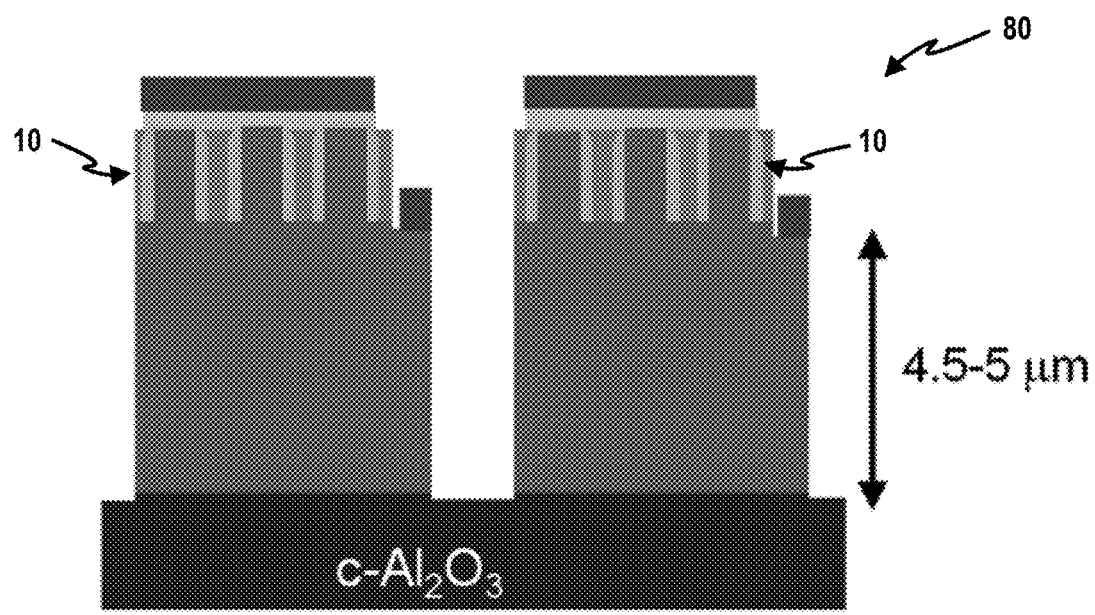
Figure 9C:
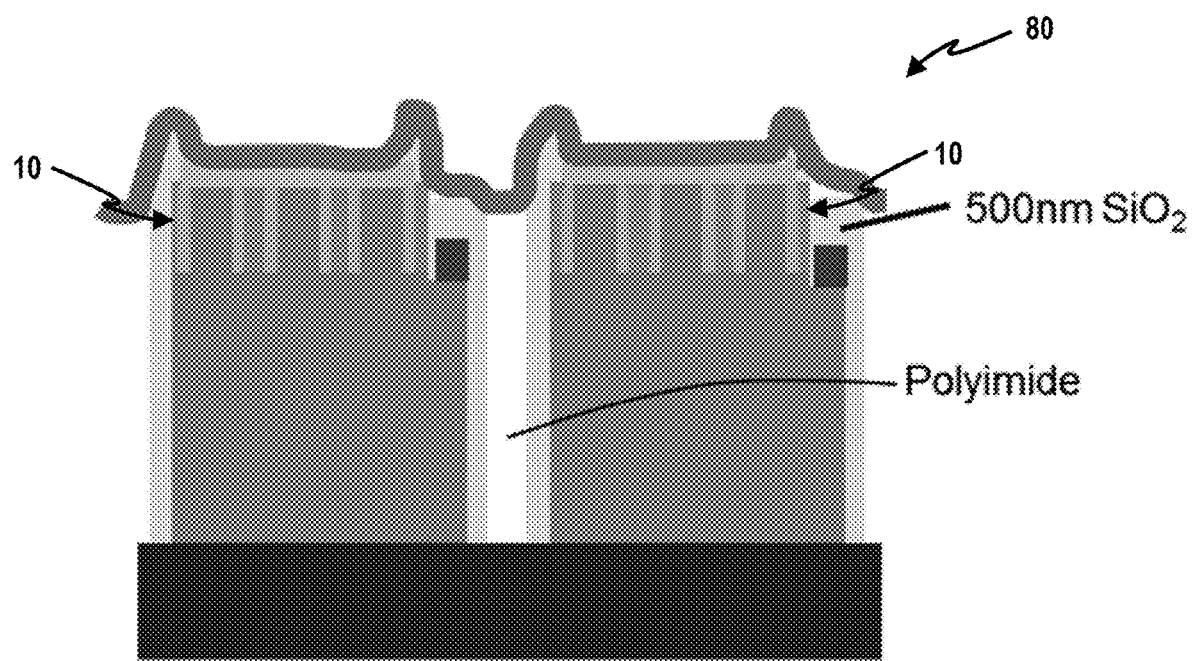
Figure 10:
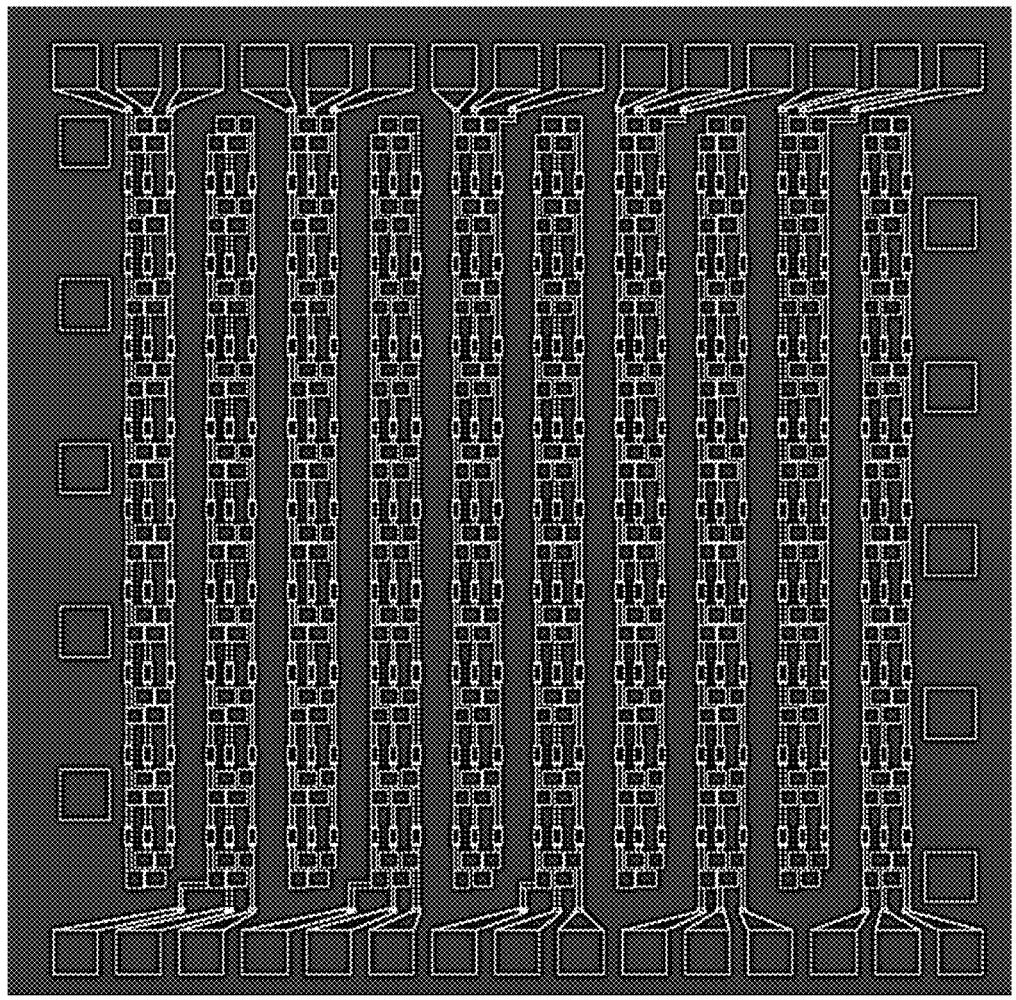
FIG. 10 is a schematic depicting the electrical interconnect for the 10×10 display.

Microdisplay is one application for the multi-color light devices 10. Multi-color light devices can be arranged in arrays to form a display 80, for example as seen in FIG. 8. In this example, light devices 10 are arranged in a 5×5 array. The light devices are fabricated on a common substrate, for example in the manner described above in relation to FIGS. 2A-2C. FIG. 9A is a cross-sectional side view showing two light devices 10 forming the display 80. To prevent cross talk between light devices in different columns, the entire n-contact layer 17 is etched away as seen in FIG. 9B. Light devices 10 in each row of the array are interconnected, for example as shown in FIG. 9C. It is noted that each light device 10 may be coated with silicon dioxide or another insulating material to prevent leakage current. In a larger variant, metal interconnects are shown for a display formed by 10×10 array of light devices 10 in FIG. 10. In another embodiment, the LED subpixel array can be flip-chipped bonded to a silicon driver. While description has been provided for a display application, it is readily understood that the multi-color light devices may be used in other applications as well, such as on-chip spectrometers, biosensors, and tunable LEDs for general illumination.

Figure 11:
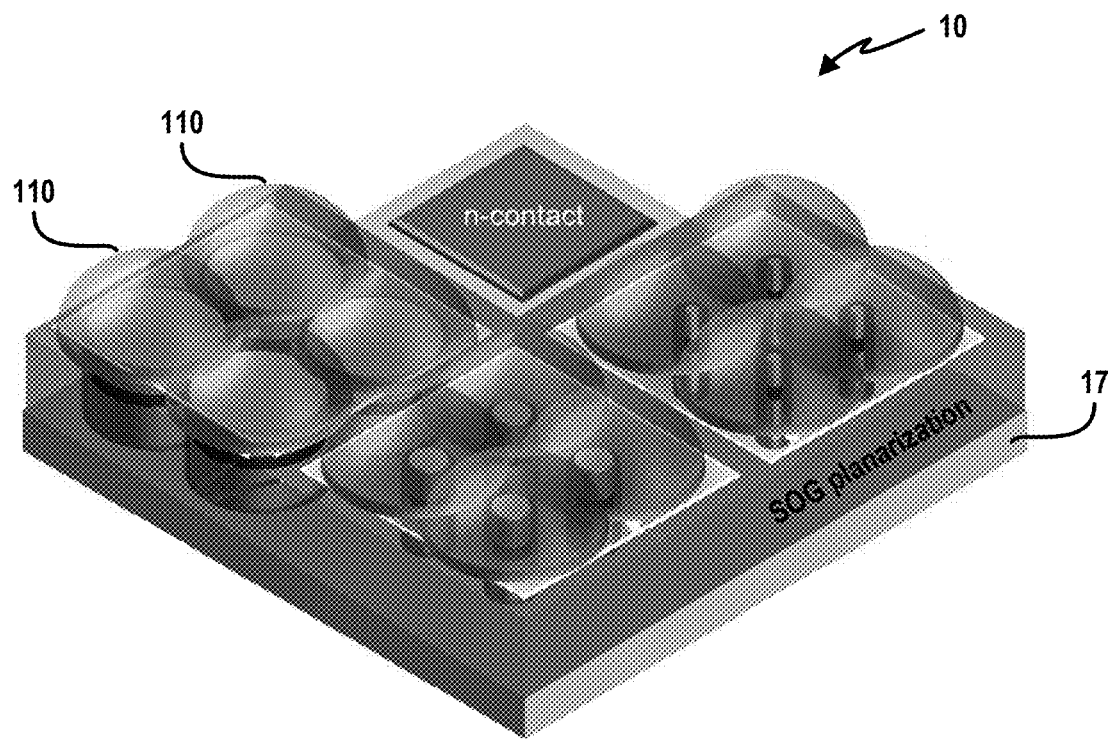
FIG. 11 is a diagram of the multi-color light device with lens placed over individual nanopillars.

In another aspect, a parabolic lens 110 may be placed over each nanopillar of the multi-color light device 10 as seen in FIG. 11. Using a parabolic dielectric lens that has its focal length matched to the active region's position enhances the light extraction from the nanopillar LED structure by increasing the extraction cone angle at the air interface and collimating the out-coupled emission. The latter is especially important for realizing an ultracompact system incorporating a large number of LED color pixels. The focal length of the lens is adjusted by changing the diameter and height of the parabolic lens.

Figure 12:
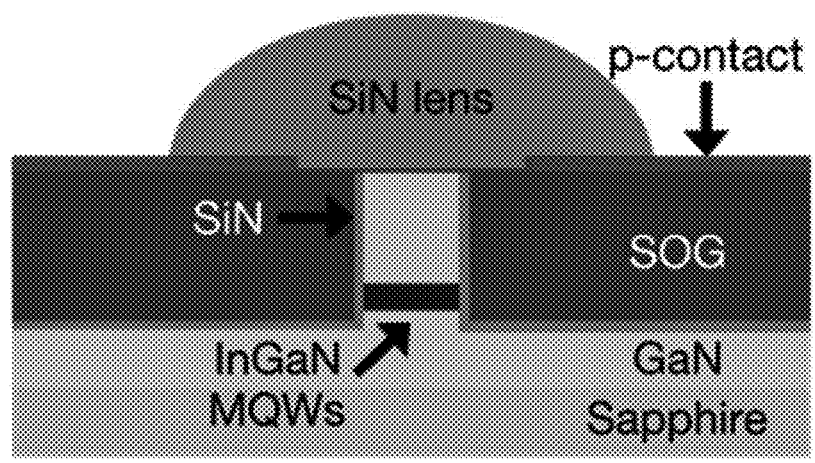
FIG. 12 is a cross-sectional side view of a nanolens formed on a light emitting device.

With reference to FIG. 12, an example profile for the parabolic lens 110 includes one parabolic side where light exits and one flat side where the emission from semiconductors is received. The parabolic lens profile makes it possible to place the focal point below the flat side, eliminating the need for an air gap between the semiconductor and the lens. The design principle is to vary the base diameter and/or height of the parabolic lens profile such that the focal point falls within the LED active region (e.g., InGaN quantum wells (QWs)). To compensate for the chromatic dispersion of red, green, and blue colors, the base diameters of the lenses are varied while fixing the heights such that all lenses can be fabricated in a one-step lithographic process.

The design was conducted using a finite-difference time-domain solver for the Maxwell's equations. With continued reference to FIG. 12, the InGaN/GaN nanopillars are 70 nm in diameter and 300 nm tall. Silicon nitride (SiN) and spin-on-glass (SOG) were used to isolate adjacent nanopillars to prevent shorting and planarize the surface for the nanolens. The tips of the nanopillars were contacted by an 8 nm/8 nm Ni/Au layer as the p-type contact. SiN was chosen as the lens material as it has a refractive index of 2.0, measured by ellipsometry, which is similar to that of GaN. The nanopillar emission was simulated as a linear dipole in the QW plane, located at the InGaN active region, which is 250 nm below the p-contact. Again, the above configurations, materials and values are presented only to describe one particular embodiment that has proven effective and should be viewed as illustrating, rather than limiting the present disclosure.

Figure 13A:
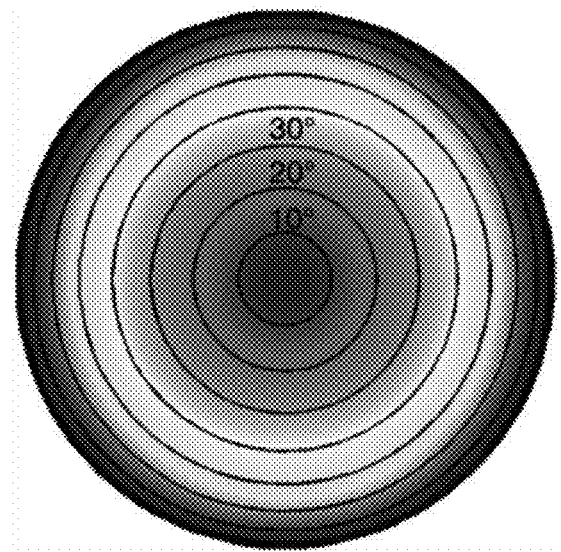
FIG. 13A is an illustration of simulation of the far field profile for a single nanopillar planarized with a nanolens.
Figure 13B:
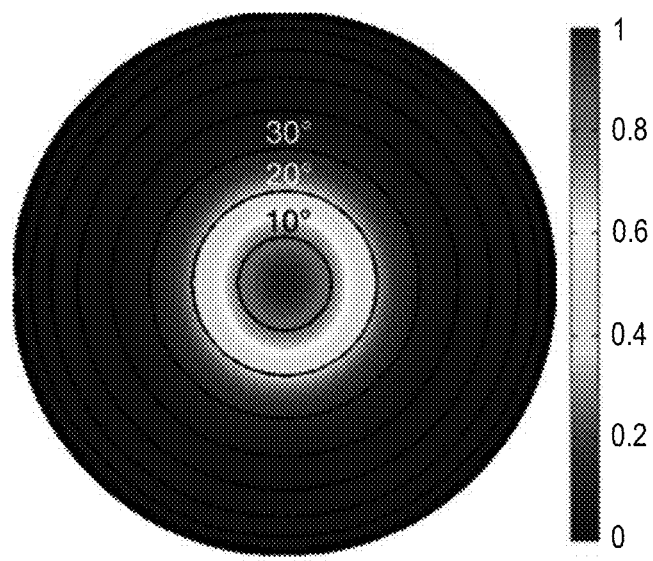
FIG. 13B is an illustration of simulation of the far field profile for a single nanopillar with a nanolens.

In simulations, the near-field emission was captured in the air above the structure and converted to a far field pattern. FIG. 13A shows the calculated far field emission pattern in air for a planarized single nanopillar without the nanolens at the wavelength of 495 nm. With a parabolic lens of a base diameter of 1 μm and height of 500 nm, the far-field emission is condensed as shown in FIG. 13B.

To benchmark the lens, the fraction of the emission is calculated within a 0.5 numerical aperture (NA), which corresponds to ±30°. In the simulation, a substrate side metal reflector layer below the n-doped GaN was also included to improve the air side light extraction, with minimal effect on the far field pattern distribution. For the nanopillar without the lens, only 27% of the emission is contained within 0.5NA. With the lens, the fraction increases to 95%, a 3.5× improvement in concentration. This corresponds to a half width half maximum (HWHM) linewidth reduction of 2.85 times. Reducing the lens base diameter below 1 μm lowers the percentage of emission within 0.5NA but allows a higher density of light-generating nanopillars. This trade-off can be optimized at the system level together with the external collimation/projection optics design.

Figure 14A:
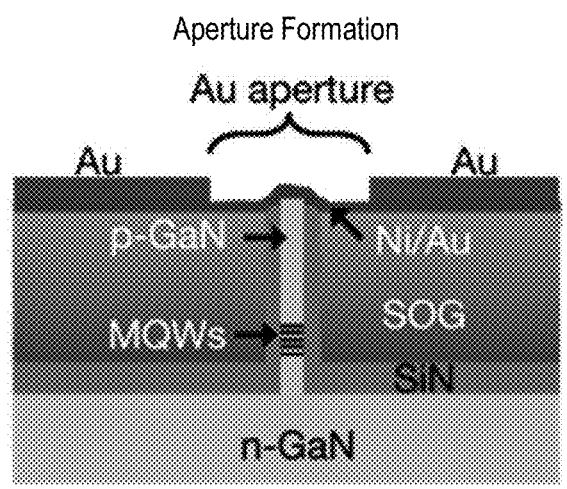
FIGS. 14A-14F are diagrams depicting an example method for fabricating a parabolic lens.
Figure 14B:
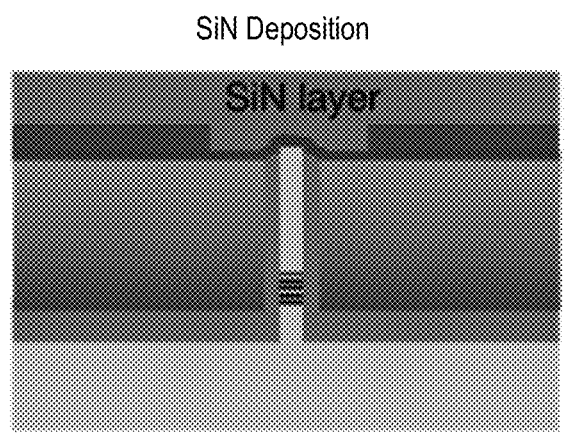

Experimentally, a resist reflow process was used to fabricate the lens as seen in FIGS. 14A-14F. For simplicity, a single nanopillar is shown in the fabrication schematic. A 495 nm wavelength micro-LED color pixel of dimensions 100 μm×100 μm is used for the proof-of-principle demonstration. The nanopillar array had a pitch of 300 nm. To accurately optically characterize the lens, a 30 nm thick gold (Au) aperture layer is added between the nanopillar array and lens array to block out the emission from neighboring nanopillars (FIG. 14A). This allows one to study the lens' effect on a single nanopillar, which makes it easier to directly compare the experiments to the numerical results. In a practical device, the gold aperture can be removed and the density of the lens array will be matched to the density of the nanopillars. The apertures have a diameter of 260 nm and are spaced 4.5 μm apart. The 100 μm×100 μm micro-LED area was divided into nine sections of approximately 30 μm by 30 μm. Five sections were randomly chosen for the lens deposition and the remaining four sections were to act as the comparison. For the proof-of-principle, the metal reflector below the n-GaN was not included.

Figure 14C:
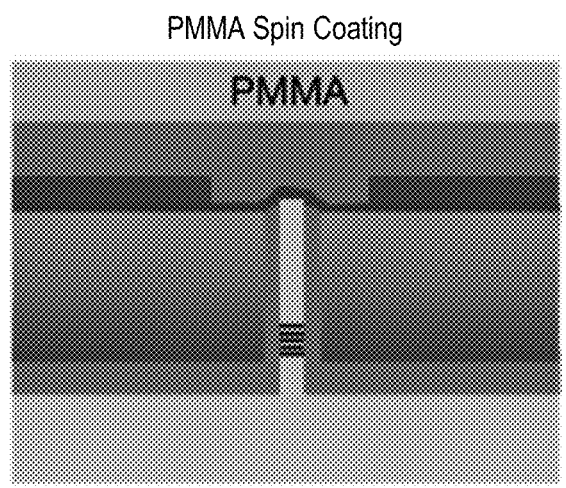
Figure 14D:
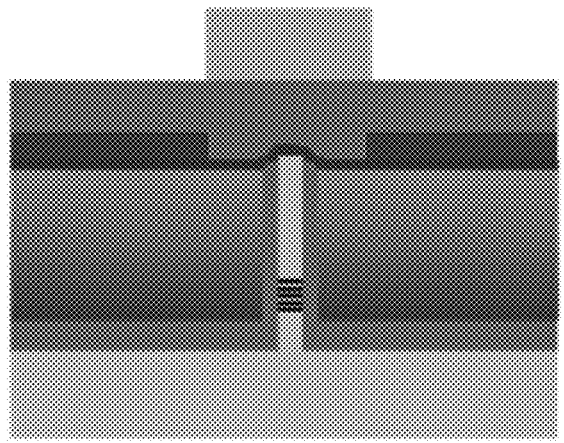
Figure 14E:
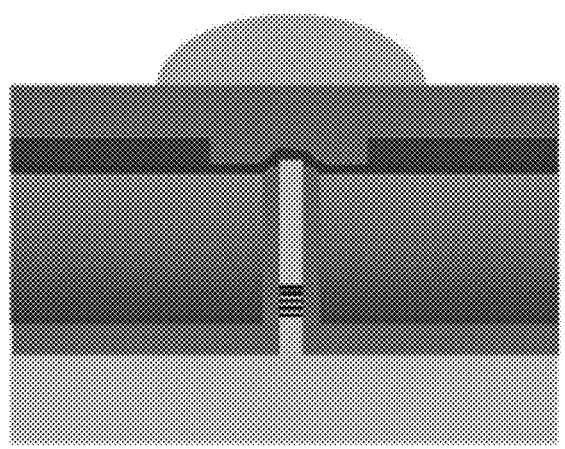
Figure 14F:
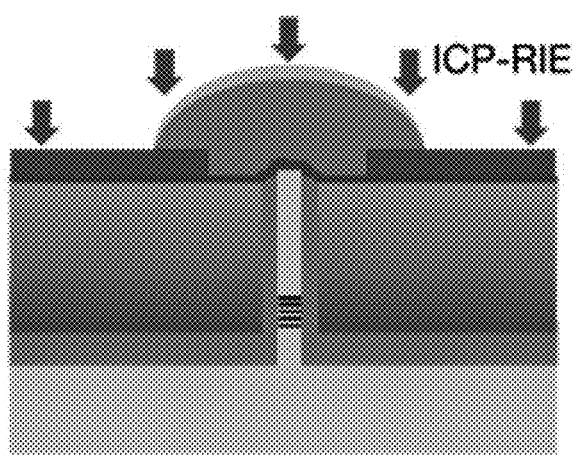

The resist reflow process is described as follows. Initially, 530 nm of SiN was deposited (FIG. 14B) at 200° C. with a rate of 30.2 nm/min, on the Au layer using plasma enhanced chemical vapor deposition (PECVD). The extra 30 nm, as compared to the desired height of the lens 500 nm, are to accommodate for the 30 nm thick gold aperture hole. PMMA A 6% E-beam photoresist was then spun on the sample for 45 sec at 3500 rpms to create a 530 nm resist layer (FIG. 14C). E-beam lithography was used to create the 1 μm diameter cylinders of PMMA across the five lens sections (FIG. 14D). These PMMA cylinders were centered to the nanopillars and have a pitch of 1.5 μm. The pitch is smaller than the aperture layer pitch to compensate for any global misalignment between the lenses and the aperture layer. The PMMA was reshaped into a parabolic profile by heating up the photoresist above its glass transition temperature (FIG. 14E). Using a hotplate in air ambient, the PMMA was heated to 125° C. for 15 minutes and 130° C. for 5 minutes, sequentially. The resist reflow caused the PMMA base diameter to increase by about 20%; however, the lens diameter was corrected during the dry etching process due to the lateral SiN etching. The parabolic shape was transferred from the PMMA into the SiN layer using Inductively coupled plasma-reactive ion etching (ICP-RIE) (FIG. 14F), with a fluorine-based recipe that etches SiN and PMMA at approximately the same rate (1:1.05). The parabolic shape from this process has been measured and confirmed using atomic force microscopy (AFM). In areas where there was no PMMA, the SiN layer was removed completely from this process. After the lens formation, the sample was wet etched in a 90° C. phosphoric acid, DI water mixture (1:1) for 30 minutes to reduce the surface roughness on the SiN lens. The diluted phosphoric acid etches SiN at a well-controlled rate of 1.2 nm/min and removes any unwanted features in the SiN from the dry etching process. The underlying Au and SOG layers were minimally affected by the wet etch and acted as an etch stop. A scanning electron microscopy (SEM) image was taken of the resulting nanolens array. There are approximately nine nanopillars under each lens structure, with the gold aperture designed to block the emission from the eight nanopillars surrounding the center nanopillar. After the lens fabrication, a 200-nm thick $SiO_2$ layer was deposited outside of the 100 µm by 100 µm LED array area to prevent shorting between the two contacts. Finally, the Ni/Au 5 nm/200 nm thick p-contact was deposited at the corner of the LED array and a common n-contact of the same composition and thickness for the sample was deposited for the electroluminescence (EL) measurement.

Figure 15:
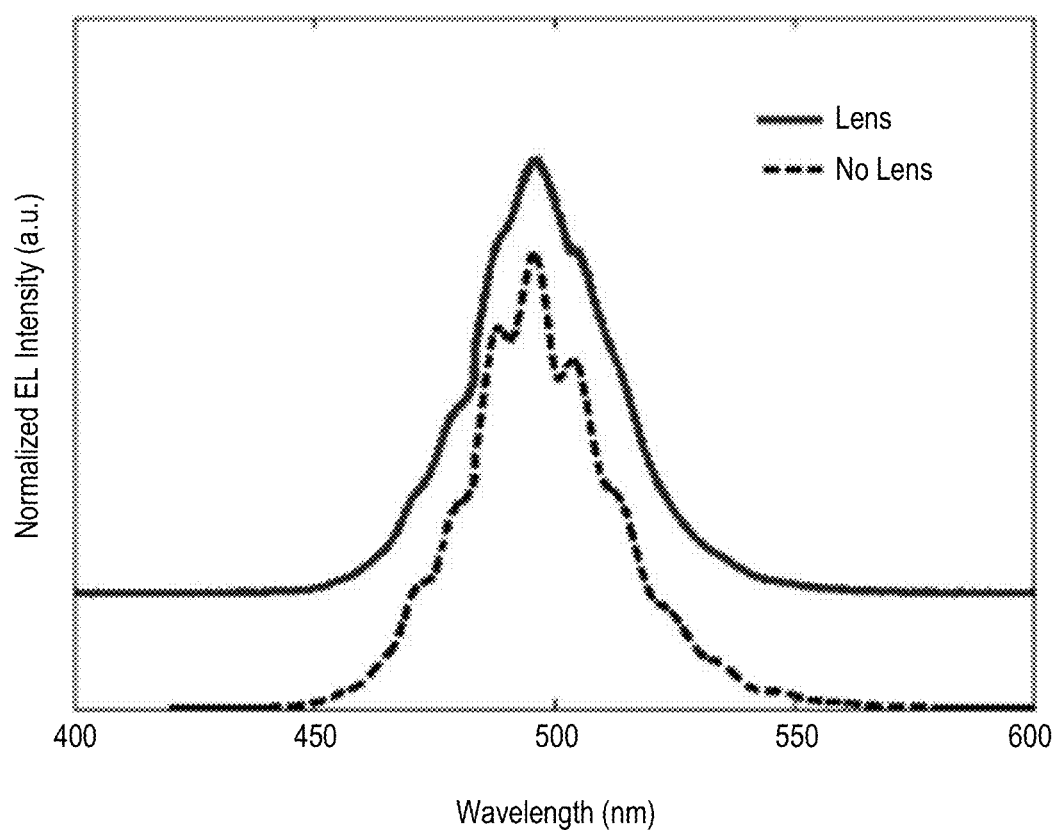
FIG. 15 is a graph depicting the normalized EL spectra from a single 70 nm diameter nanopillar with and without the lens.

EL from the device was measured with a constant applied forward voltage at 8V. The light emission was collected with a 0.6 NA objective lens. The angular intensity distribution was measured using a series of confocal lenses and was imaged onto a charge-coupled device (CCD) camera. To isolate the emission from an individual nanopillar, a 100 µm pinhole was placed in the focal plane of the first lens pair. All measurements were taken at room temperature without any cooling. The normalized EL spectra were taken for a randomly selected nanopillar with a lens (blue, solid) and a nanopillar without the nanolens (black, dotted) as shown in FIG. 15. The Fabry-Perot fringes observed in the no-lens case are reduced with the nanolens. The curved SiN lens interface increases the escape angle of the emission and acts as an index gradient between the GaN and air interfaces, reducing the fringes. Otherwise, the two spectra are nearly identical since the lens should not affect the emission wavelength.

Figure 16:
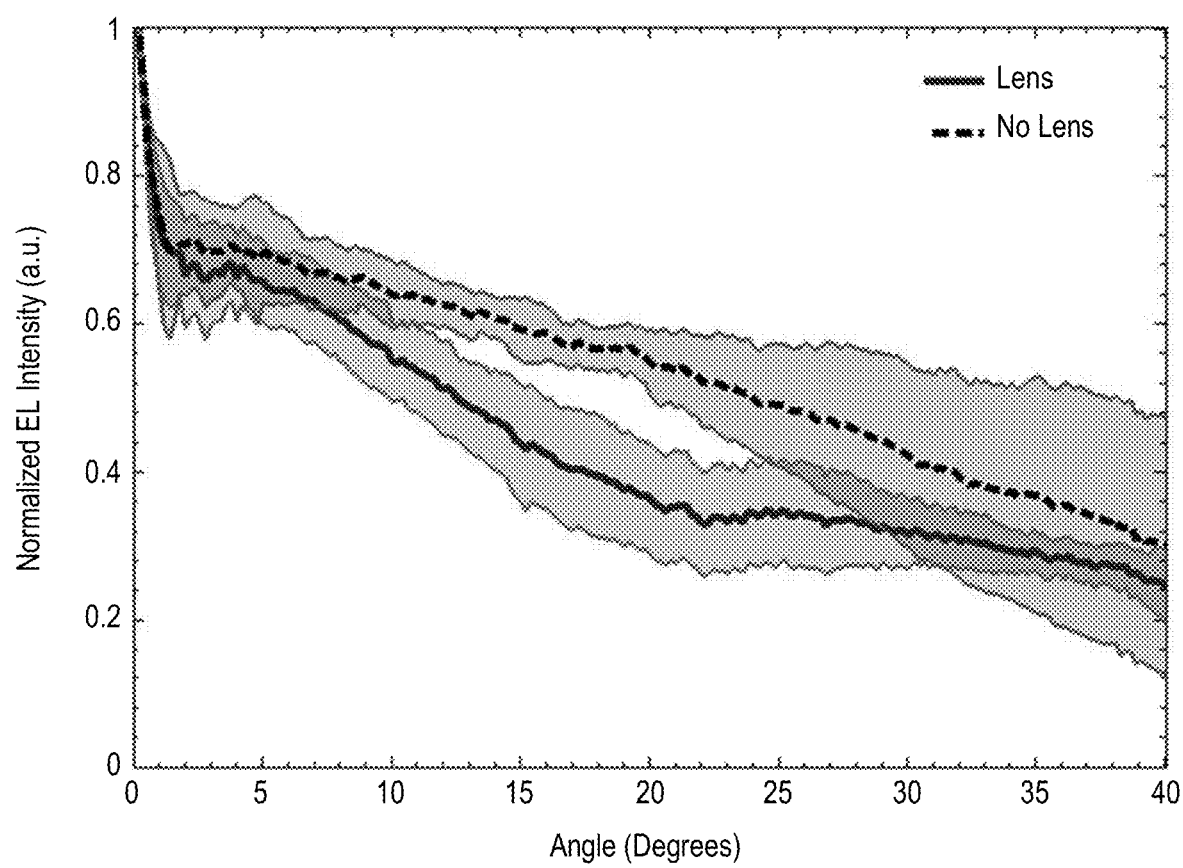
FIG. 16 is a graph depicting a comparison of the k-space distribution for seven nanopillars with a nanolens (solid line) and seven nanopillars without a nanolens (dashed line), where the shaded region corresponds to the standard deviation.

Characterization of the signal collimation is done by calculating the angular spread of the two k-space field patterns. The signal maximum is 0° and the counts are summed in increments of 0.2° towards the edge of the measurement area. For each angular increment, the summed intensity is normalized by the number of data points within the increment. With the ring summation method, the effect of the nanolens can be discerned in FIG. 16. The average of seven lens coupled k-space patterns and seven k-space patterns without nanolenses were plotted with their respective standard deviations. The HWHM linewidth of the average emission intensity is reduced by a factor of ~2× from 23.8° to 12.4° with the nanolens. For the nanopillars, the HWHM linewidth of the emission intensity is reduced from 19.9° to 9.5° with the nanolens. The satellite peak contribution at the higher angles can be seen clearly by this method, as the rate of decay for the nanolens average intensity decreases at higher angles, whereas the k-space decay without the lens is relatively constant.

Color tuning the lens design to work for the RGB LED color pixels requires adjustments to the lens dimensions for each color, to ensure proper focal lengths matching. With the desire to simplify fabrication costs and complexity, the lens height of 500 nm remains unchanged for each color, such that no additional fabrication steps are required. Thus, in order to meet these criteria, the lens base diameter is used as tuning parameter. Multiple lens diameters can be achieved during lithography without additional fabrication steps being added.

For color tuning numerically, varying lens base diameter is studied. For the blue, green, and red emitting nanopillars, with diameters of 50 nm, 100 nm, and 1 µm, and peak emission wavelengths of 495 nm, 540 nm, and 625 nm respectively, the optimized lens base diameters are 1 µm, 1 µm, and 1.2 µm. This results in an increase in the percentage of emission within 0.5NA for blue by 3.06×, green by 2.30×, and red by 2.78×, to 95%, 83%, and 75%, respectively. There is a drop-off in the collimation for green and red compared to blue, as the emission wavelength increases but the lens height does not change. So, the collimation power is limited by the lens height.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A multi-color light device, comprising:
    a substrate;
    two or more subpixels formed on the substrate, each subpixel includes one or more light emitting diodes (LEDs) and each light emitting diode is a nanopillar, such that diameter of the nanopillars between the two or more subpixels is different and the diameter of nanopillars within a given subpixel is the same;
    a plurality of lens, such that a lens is formed over top of each of the light emitting diodes in the two or more subpixels and each lens is configured to have its focal point in an active region of corresponding nanopillar;
    wherein the active region of the nanopillars are in shape of a disc and the active region of the nanopillars have same material composition and same thickness across the two or more subpixels; and
    a controller independently coupled to the light emitting diodes in each of the two or more subpixels and configured to supply driving signals to the light emitting diodes in each of the two or more subpixels, where the driving signals are pulse width modulated, such that magnitude of driving signals is the same amongst the two or more subpixels and duty cycles of the driving signals are adjustable independently amongst the two or more subpixels.

2. The multi-color device of claim 1 wherein each nanopillar is comprised of a p-type semiconductor separated by one or more quantum wells from an n-type semiconductor.

3. The multi-color device of claim 1 wherein each of the two of more subpixels is interfaced with the controller via a respective electrical contact disposed over the corresponding subpixel and a common electrical contract disposed underneath the two or more subpixels.

4. The multi-color device of claim 3 wherein the controller determines the intensity ratio between the two or more subpixels using a chromaticity diagram.

5. The multi-color device of claim 1 wherein the two or more subpixels are defined as a red subpixel that emits red light, a blue subpixel that emits blue light and a green subpixel that emits green light.

6. The multi-color device of claim 1 wherein controller is configured to receive a desired color and operates to determine an intensity ratio between the two of more subpixels to achieve the desired color and sets the duty cycle of the driving signals in accordance with the determined intensity ratios.

7. The multi-color device of claim 1 wherein each lens in the plurality of lens having a parabolic profile.

8. A multi-color light device, comprising:
    a substrate;
    three subpixels formed on the substrate, each subpixel includes one or more nanopillars serving as light emitting diodes (LEDs), such that diameter of the nanopillars within a given subpixel is the same and diameter of nanopillars differs between the three subpixels;
    a plurality of lens, such that a lens is formed over top of each of the light emitting diodes in the three subpixels and each lens is configured to have its focal point in an active region of corresponding nanopillar;
    wherein the active region of each of the nanopillars is in shape of a disc and the active region of the nanopillars have same material composition and same thickness across the two or more subpixels; and
    a controller electrically coupled to the nanopillars in each of the three subpixels and configured to supply driving signals to the nanopillars in each of the three subpixels, such that magnitude of driving signals is the same amongst the three subpixels and duty cycles of the driving signals are adjustable independently amongst the three subpixels,
    wherein controller determines an intensity ratio between the three subpixels to achieve a desired color of light and sets the duty cycle of the driving signals in accordance with the determined intensity ratios.

9. The multi-color device of claim 8 wherein each nanopillar is comprised of a p-type semiconductor separated by one or more quantum wells from an n-type semiconductor.

10. The multi-color device of claim 8 wherein each of the three subpixels is interfaced with the controller via a respective electrical contact disposed over the corresponding subpixel and a common electrical contract disposed underneath the three subpixels.

11. The multi-color device of claim 8 wherein the three subpixels are defined as a red subpixel that emits red light, a blue subpixel that emits blue light and a green subpixel that emits green light.

12. The multi-color device of claim 8 wherein the controller determines the intensity ratio between the three subpixels using a chromaticity diagram.

13. The multi-color device of claim 12 wherein the controller is configured to receive the desired color, plot a triangle on the chromaticity diagram and mark the desired color on the chromaticity diagram, where the corners of the triangle corresponding to color coordinates of the light color emitted by each of the three subpixels.

14. The multi-color device of claim 12 wherein the controller determines the intensity ratios by drawing a line from one of the corners of the triangle until the line intersects an opposing side of the triangle, such that the line passes through the mark for the desired color, compute a first ratio between segments of the opposing side of the triangle intersected by the line, and compute a second ratio between segments of the line separated by the mark for the desired color and falling within the triangle, where the intensity ratios are defined by the first ratio and the second ratio.

15. The multi-color device of claim 8 wherein each lens in the plurality of lens having a parabolic profile.

16. A microdisplay, comprising
a plurality of light devices arranged in an array;
each light device includes two or more subpixels, each subpixel having one or more nanopillars serving as light emitting diodes (LEDs), such that diameter of the nanopillars within a given subpixel is the same but diameter of nanopillars differs between the three subpixels;
a plurality of lens, such that a lens is formed over top of each of the light emitting diodes in the two or more subpixels and each lens having a parabolic profile and configured to have its focal point in an active region of corresponding nanopillar;
wherein the active region of each of the nanopillars is in shape of a disc and the active region of the nanopillars have same material composition and same thickness across the two or more subpixels;
a power supply circuit that generates driving signals; and
a controller electrically coupled to the nanopillars in each of the two or more subpixels and configured to control the driving signals supplied to the nanopillars in each of the two or more subpixels, such that magnitude of driving signals is the same amongst the two or more subpixels but duty cycle of the driving signals are adjustable independently amongst the two or more subpixels.

* * * * *